(12) United States Patent
Yoon et al.

(10) Patent No.: US 7,897,299 B2
(45) Date of Patent: Mar. 1, 2011

(54) PHASE-SHIFT MASK AND METHOD OF FORMING THE SAME

(75) Inventors: Gi-Sung Yoon, Yongin-si (KR); Hee-Bom Kim, Suwon-si (KR); Sun-Young Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 352 days.

(21) Appl. No.: 12/002,275

(22) Filed: Dec. 13, 2007

(65) Prior Publication Data

US 2008/0145771 A1 Jun. 19, 2008

(30) Foreign Application Priority Data

Dec. 14, 2006 (KR) .................. 10-2006-0127625

(51) Int. Cl.
*G03F 1/00* (2006.01)
(52) U.S. Cl. .................. 430/5; 430/311; 430/394
(58) Field of Classification Search .............. 430/5; 355/601
See application file for complete search history.

(56) References Cited

U.S. PATENT DOCUMENTS

| 4,369,239 | A | * | 1/1983 | Feinberg et al. | ................ | 430/5 |
|---|---|---|---|---|---|---|
| 5,766,805 | A | | 6/1998 | Lee et al. | | |
| 5,783,337 | A | * | 7/1998 | Tzu et al. | ................ | 430/5 |
| 2002/0068228 | A1 | * | 6/2002 | Kureishi et al. | ................ | 430/5 |
| 2003/0180631 | A1 | * | 9/2003 | Shiota et al. | ................ | 430/5 |
| 2005/0190450 | A1 | * | 9/2005 | Becker et al. | ................ | 359/601 |
| 2006/0115742 | A1 | * | 6/2006 | Aton | ................ | 430/5 |

FOREIGN PATENT DOCUMENTS

| JP | 07-253653 | 10/1995 |
|---|---|---|
| JP | 08-062822 | 3/1996 |
| KR | 10-0179164 | 11/1998 |
| KR | 10-2006-0120613 | 11/2006 |
| WO | WO 2005/024518 A2 | 3/2005 |

* cited by examiner

*Primary Examiner*—Mark F Huff
*Assistant Examiner*—Rashid Alam
(74) *Attorney, Agent, or Firm*—Mills & Onello, LLP

(57) ABSTRACT

In an attenuated phase-shift mask (PSM) and a method of forming the same, a phase-shift layer and a light-shielding layer are sequentially stacked on a transparent substrate. The phase-shift layer and the light-shielding layer are sequentially removed from the substrate, to form a light-shielding pattern including a first opening and a phase-shift pattern including a second opening that is connected to the first opening and partially exposes the transparent substrate. Then, a transmitting portion is formed through the light-shielding pattern by partially removing the light-shielding pattern. The transmitting portion includes at least one portion of the phase-shift pattern on which a transmittance controller is formed. In one embodiment, the transmittance controller comprises a metal having a high absorption coefficient, and is formed through sputtering and diffusion processes. Accordingly, the intensity deviation between $0^{th}$ and $1^{st}$ order beams may be decreased, to thereby improve the processing margin of the exposure process.

18 Claims, 8 Drawing Sheets

PHASE-SHIFT MASK AND METHOD OF FORMING THE SAME

CROSS-REFERENCE TO RELATED APPLICATIONS

This application claims priority under 35 U.S.C. §119 to Korean Patent Application No. 10-2006-0127625, filed on Dec. 14, 2006 in the Korean Intellectual Property Office (KIPO), the contents of which are herein incorporated by reference in their entirety.

BACKGROUND OF THE INVENTION

1. Field of the Invention

Example embodiments of the present invention relate to a phase-shift mask (PSM) and a method of forming the same. More particularly, example embodiments of the present invention relate to an attenuated PSM for minimizing an intensity difference between a $0^{th}$ order beam and a $1^{st}$ order beam, and a method of forming the same.

2. Description of the Related Art

As semiconductor devices continue to become more highly integrated, design rules for the devices are becoming gradually reduced so that the critical dimensions (CDs) of the semiconductor devices are currently becoming scaled down to about 0.07 μm, or less. The above reduction of the design rules and the CDs necessarily causes the various patterns for the semiconductor devices to have high resolution.

Various resolution enhancement technologies (RETs) have been applied to processes for manufacturing semiconductor devices so as to form high-resolution patterns. For example, methods have been suggested for increasing the numerical aperture (NA) of a lens so as to irradiate illumination light onto a minute area of an object in an exposure system, and improving the illumination light to have a short wavelength through a dipole or a cross-pole illumination process. Particularly, a krypton fluoride (KrF) excimer laser having a wavelength of about 248 nm, an argon fluoride (ArF) excimer laser having a wavelength of about 193 nm and a fluorine (F2) excimer laser having a wavelength of about 157 nm are widely used as the illumination light of the exposure system in accordance with the technical trend of high-integration degrees of semiconductor devices. Accordingly, the resolution of a pattern may be sufficiently increased by using short-wavelength light as the illumination light. However, the short wavelength light also causes deterioration of depth of focus (DOF) in an exposure process. For that reason, the RETs commonly adopt a phase-shift mask (PSM) so as to avoid deterioration of the DOF. An initial PSM includes various stepped portions that are formed or arranged in a transparent substrate, and thus the phase of the light penetrating through the PSM is shifted by the stepped portions. However, more recent PSMs have been configured to include an additional layer that is formed on a transparent substrate, and thus the phase of the illumination light is shifted by the additional layer. Particularly, an attenuated PSM has been widely used for forming a large-aspect-ratio pattern such as a contact hole, or an isolation pattern.

The attenuated PSM may shift the phase of the illumination light and control the transmittance of the illumination light using a single layer or a double layer in such a manner that the intensity of a $0^{th}$ order beam becomes similar to that of a $1^{st}$ order beam of the illumination light. As a result, the attenuated PSM allows an object to undergo a uniform exposure in an exposure system. A $2^{nd}$ order or higher beam of the illumination light may hardly be irradiated onto the same position as the $0^{th}$ order beam due to the recent reduction in pattern sizes. For that reason, the light intensity of an illumination site on the object is generally estimated based on the $0^{th}$ and $1^{st}$ order beams of the illumination light. That is, when an intensity difference (hereinafter referred to as intensity deviation) between the $0^{th}$ and the $1^{st}$ order beams is within an allowable range, the $0^{th}$ and the $1^{st}$ order beams irradiated onto an exposure site of the object may be substantially treated as a single beam having a uniform intensity, and thus a circuit pattern on a mask may be accurately transcribed onto the object.

However, the recent reduction of CDs and pattern sizes of semiconductor devices may also cause a decrease of the transmission area of the attenuated PSM, to thereby increase the intensity deviation between the $0^{th}$ and the $1^{st}$ order beams. As a result, the solubility of a first portion of the exposure site onto which the $0^{th}$ order beam is irradiated can be different from that of a second portion of the exposure site onto which the $1^{st}$ order beam is irradiated, and thus there is a problem in that the circuit pattern on the mask may not be accurately transcribed onto the object.

FIG. 1 is a graph showing intensities of the $0^{th}$ and the $1^{st}$ order beams diffracted by a conventional attenuated PSM. In FIG. 1, the vertical axis represents beam intensity, and the horizontal axis represents a pattern size.

Referring to FIG. 1, as the pattern size becomes smaller, the intensity deviation between the $0^{th}$ and the $1^{st}$ order beams becomes greater. Particularly, as the pattern size decreases, the intensity of the $0^{th}$ order beam is decreased and the intensity of the $1^{st}$ order beam is not substantially changed. As a result, as the pattern size decreases, the intensity deviation is increased. Particularly, the intensity deviation when the pattern size is about 40 nm is about two times the intensity deviation when the pattern size is about 100 nm.

In an effort to decrease the intensity deviation between the $0^{th}$ and the $1^{st}$ order beams, there has been suggested that a phase-edge PSM (PEPSM), which compensates for a phase shift at an edge of a light-shielding pattern, or a chromeless mask (CLM), be used in place of the attenuated PSM. However, there is a problem in that use of the above PEPSM or CLM requires an additional process, which can decrease process efficiency in a manufacturing process of a semiconductor device.

SUMMARY OF THE INVENTION

Accordingly, embodiments of the present invention provide a phase-shift mask (PSM) for decreasing an intensity deviation between the $0^{th}$ and the $1^{st}$ order beams at an exposure site of an object. An improved attenuated PSM is provided, in which the intensity deviation is sufficiently decreased at the exposure site of the object, despite size reduction in a light-shielding pattern.

Embodiments of the present invention also provide a method of manufacturing the above PSM.

According to an aspect of the present invention, there is provided a PSM including a transmittance controller. The PSM includes a transparent substrate through which light passes, a light-shielding pattern that is positioned on the transparent substrate and may prevent the light from being incident onto the transparent substrate, a phase-shift pattern that is positioned on the transparent substrate exposed through the transmitting portion and a transmittance controller that is positioned at an upper portion of the phase-shift pattern in the transmitting portion. The light-shielding pattern defines a transmitting portion through which the transparent substrate is partially exposed and the light is incident onto the transparent substrate, and the phase-shift pattern shifts the phase of the light that passes through the transmitting portion. The transmittance controller controls the transmittance of the light with respect to the phase-shift pattern in the transmitting portion.

In some example embodiments, the transmitting portion has a shape corresponding to a circuit pattern that is to be transcribed onto a semiconductor substrate for manufacturing a semiconductor device, and the phase-shift pattern comprises molybdenum (Mo) and the light-shielding pattern comprises chromium (Cr). The transmittance controller can include a material selected from the group consisting of chromium (Cr), molybdenum (Mo) and tungsten (W), and controls the transmittance of the light passing through the phase-shift pattern, to thereby decrease an intensity deviation between $0^{th}$ and $1^{st}$ order beams of the light. The light includes an argon fluoride (ArF) excimer laser and the transmittance controller includes a diffusion layer having a diffusion depth of about 100 nm to about 500 nm from a top surface of the phase-shift pattern. The phase-shift pattern has a thickness of about 400 Å to about 600 Å from a surface of the transparent substrate.

According to another aspect of the present invention, there is provided a method of forming a PSM. A phase-shift layer and a light-shielding layer are sequentially formed on a transparent substrate, to thereby form a blank mask on the transparent substrate. A light-shielding pattern and a phase-shift pattern are formed on the transparent substrate by consecutively and partially removing the phase-shift layer and the light-shielding layer. The light-shielding pattern includes a first opening and the phase-shift pattern includes a second opening that is connected to the first opening and partially exposes the transparent substrate. A transmitting portion is formed in the light-shielding pattern by partially removing the light-shielding pattern. The transmitting portion includes at least one portion of the phase-shift pattern on which a transmittance controller is formed.

In one example embodiment, the phase-shift layer comprises a material selected from the group consisting of molybdenum (Mo), molybdenum silicon (MoSi), molybdenum silicon nitride (MoSiN), molybdenum silicon oxynitride (MoSiON), molybdenum silicon carbonitride (MoSiCN), and molybdenum silicon carbon oxynitride (MoSiCON), and the light-shielding layer comprises a material selected from the group consisting of chromium (Cr), chromium nitride (CrN), chromium carbide (CrC), and chromium carbonitride (CrCN). In some example, embodiments, the transparent substrate can comprise quartz, and the blank mask includes an object mask for an attenuated PSM.

In some example, embodiments, forming the light-shielding pattern and the phase-shift pattern includes: forming a first mask pattern on a surface of the blank mask; partially etching the light-shielding layer using the first mask pattern as an etching mask, to thereby form the light-shielding pattern including the first opening through which the phase-shift layer is partially exposed; removing the first mask pattern from a surface of the light-shielding pattern; and partially etching the phase-shift layer using the light-shielding pattern as an etching mask, to thereby form the phase-shift pattern including the second opening that is connected to the first opening. The first mask pattern can include a photoresist pattern that is formed on the blank mask by a photolithography process. Etching of the light-shielding layer and the phase-shift layer can be performed by a dry etching process using a mixture of chlorine (Cl2) gas and oxygen (O2) gas as an etching gas, or can be performed by a wet etching process using a mixture of ceric ammonium nitrate (Ce(NH4)2(NO3)6) and perchloric acid (HClO4) as an etchant.

In some example embodiments, forming the light-shielding pattern and the phase-shift pattern can include: forming a first mask pattern on a surface of the blank mask; partially etching the light-shielding layer and the phase-shift layer sequentially using the first mask as an etching mask, to thereby form the second opening through which the transparent substrate is partially exposed and the first opening that is connected to the second opening; and removing the first mask pattern from a surface of the light-shielding pattern.

In some example embodiments, the transmitting portion may be formed through the following example steps. A mask layer is formed on the light-shielding pattern to a sufficient thickness to fill up the first and second openings, and the mask layer is partially removed from the light-shielding pattern, to thereby form a second mask pattern through which at least one light-shielding pattern is exposed. The light-shielding pattern exposed through the second mask pattern is etched off using the second mask pattern as an etching mask, to thereby form a preliminary transmitting portion through which the phase-shift pattern is exposed. Then, a thin layer is formed on the phase-shift pattern exposed through the preliminary transmitting portion, and a material of the thin layer is diffused into the phase-shift pattern.

The light-shielding layer may be removed from the substrate by a dry etching process using a mixture of chlorine (Cl2) gas and oxygen (O2) gas as an etching gas, or by a wet etching process using a mixture of ceric ammonium nitrate (Ce(NH4)2(NO3)6) and perchloric acid (HClO4) as an etchant. Forming the thin layer on the phase-shift pattern can include depositing a metal material onto a surface of the phase-shift pattern exposed through the preliminary transmitting portion using the second mask pattern on the light-shielding pattern as a deposition mask. The metal material can have an absorption coefficient of no less than about 1.5, and the metal material can include any one selected from the group consisting of chromium (Cr), molybdenum (Mo), tungsten (W) and combinations thereof. The metal material can be deposited onto the phase-shift pattern by a physical vapor deposition (PVD) process such as a sputtering process that is performed using bias power of about 600 W to about 4,500 W using helium (He) gas or argon (Ar) gas as a sputtering gas. The material of the thin layer may be diffused into the phase-shift pattern by an annealing process. For example, the annealing process may be performed in a rapid thermal treatment apparatus using a tungsten-halogen lamp as a heat source. Prior to the annealing process, the second mask pattern can be removed from the transparent substrate, so that the transparent substrate is exposed through the phase-shift pattern.

According to example embodiments of the present invention, a transmittance controller is formed on an upper portion of a phase-shift pattern of an attenuated PSM, and controls an amount of light transmitted to an object substrate, thereby minimizing an intensity deviation between $0^{th}$ and $1^{st}$ order beams of illumination light at the object substrate. Therefore, the pattern may be uniformly formed on the object substrate by an exposure process using the attenuated PSM including the transmittance controller.

BRIEF DESCRIPTION OF THE DRAWINGS

The above and other features and advantages of the embodiments of the present invention will become readily apparent by reference to the following detailed description when considering in conjunction with the accompanying drawings, in which.

DETAILED DESCRIPTION OF EMBODIMENTS

Figure 1:
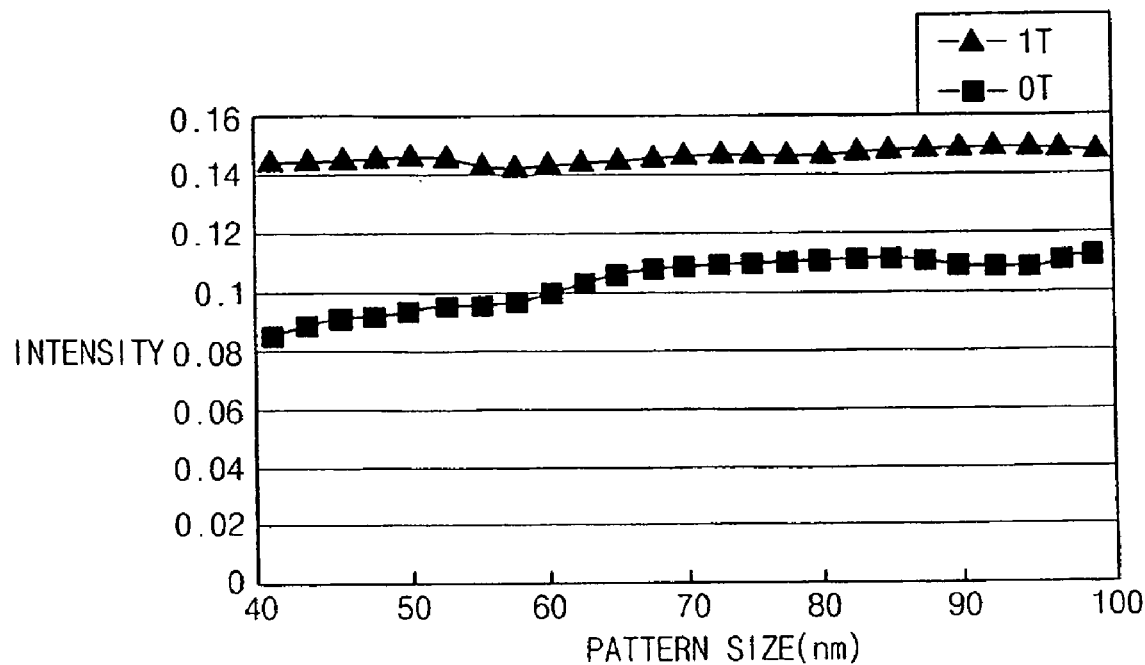
FIG. 1 is a graph showing intensities of the $0^{th}$ and the $1^{st}$ order beams diffracted by a conventional attenuated phase-shift mask (PSM)

Embodiments of the invention are described more fully hereinafter with reference to the accompanying drawings, in which example embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
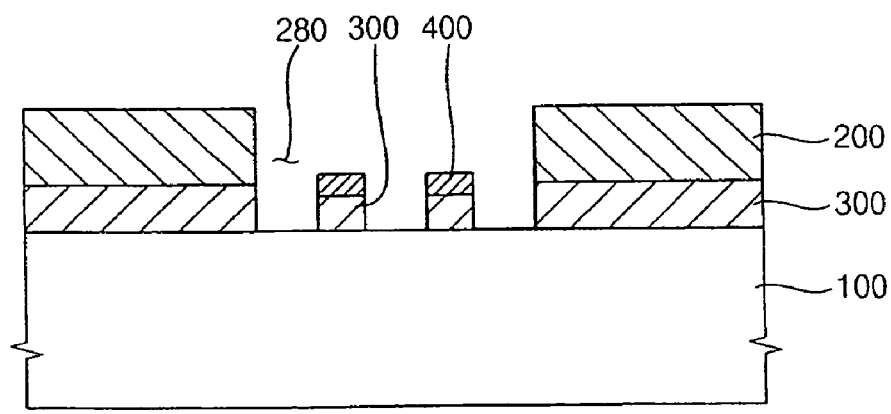
FIG. 2 is a cross-sectional view illustrating a phase-shift mask in accordance with an example embodiment of the present invention.

FIG. 2 is a cross-sectional view illustrating a phase-shift mask (PSM) in accordance with an example embodiment of the present invention.

Referring to FIG. 2, a PSM 900 in accordance with an example embodiment of the present invention includes a transparent substrate 100 through which illumination light passes, a light-shielding pattern 200 and a phase-shift pattern 300 on the transparent substrate 100 and a transmittance controller 400, or transmittance control pattern, on the phase-shift pattern 300.

For example, the transparent substrate 100 may include a glass substrate comprising quartz, and thus most of the illumination light incident thereto passes through the transparent substrate 100. An optional, supplementary thin layer such as an indium tin oxide layer may be further formed on the transparent substrate 100.

The light-shielding pattern 200 for shielding the illumination light and the phase-shift pattern 300 for shifting the phase of the illumination light are positioned on the transparent substrate 100. In the present embodiment, the phase-shift pattern 300 and the light-shielding pattern 200 are sequentially stacked on a top surface of the transparent substrate 100.

The light-shielding pattern 200 is positioned on the transparent substrate 100, and operates to prevent the illumination light from passing through the substrate 100. In example embodiments of the present invention, the light-shielding pattern 200 may comprise chromium (Cr), chromium nitride (CrN), chromium carbide (CrC) or chromium carbonitride (CrCN). These may be used alone or in combinations thereof. The light-shielding pattern 200 includes an opening 280 through which the transparent substrate 100 is partially exposed, so that the illumination light is partially incident onto the transparent substrate 100 through the opening 280 of the light-shielding pattern 200. Hereinafter, the opening 280 of the light-shielding pattern 200 is referred to as a transmitting portion 280 of the light-shielding pattern 200. As a result, the transmitting portion 280 has the same shape as a circuit pattern that is to be transcribed onto a semiconductor substrate for a semiconductor device. Accordingly, the top surface of the transparent substrate 100 is partially exposed in correspondence with the transmitting portion 280, and other portions of the top surface of the transparent substrate 100 are covered by the light-shielding pattern 200. As a result, the illumination light is incident onto the transparent substrate 100 in accordance with the circuit pattern.

The phase-shift pattern 300 may be interposed between the light-shielding pattern 200 and the transparent substrate 100, so that the phase of the illumination light is shifted before being incident onto the transparent substrate 100, to thereby control the intensity of a coherent light due to interference between diffracted beams of the illumination light. Particularly, the light-shielding pattern 200 is partially removed from the substrate 100, and no light-shielding pattern 200 is positioned in the transmitting portion 280 and the transparent substrate 100 is partially exposed through the transmitting portion 280. Therefore, only portions of the phase-shift pattern 300 are positioned in the transmitting portion 280, without the light-shielding pattern 200.

In example embodiments, the phase-shift pattern 300 may comprise molybdenum (Mo), molybdenum silicon (MoSi), molybdenum silicon nitride (MoSiN), molybdenum silicon oxynitride (MoSiON), molybdenum silicon carbonitride (MoSiCN), or molybdenum silicon carbon oxynitride (MoSiCON). These may be used alone or in combinations thereof.

The illumination light incident onto the phase-shift pattern 300 is transmitted through the phase-shift pattern 300 at a given transmittance, and the phase of the transmitted light is shifted at an angle with respect to that of the incident light onto the phase-shift pattern 300. When the PSM 900 is used as a mask pattern in an exposure process, the illumination light penetrates through the transmitting portion 280 of the light-shielding pattern 200 and the illumination light is diffracted by the phase-shift pattern 300. Each of the diffracted beams of the illumination light interferes with one another constructively or destructively on a semiconductor substrate. That is, the illumination light is transformed into a coherent light on the semiconductor substrate. In the present embodiment, $0^{th}$ and $1^{st}$ order beams are mainly used as a light source for exposing the semiconductor substrate. The $0^{th}$ order beam indicates the diffracted beam of the illumination light that does not interfere with any other diffracted beams of the illumination light, and the $1^{st}$ order beam indicates a coherent beam in which the diffracted beams of the illumination light constructively interfere with each other at a position firstly close to the $0^{th}$ order beam of the illumination light. The phase-shift pattern 300 shifts the phase of the illumination light passing through the phase-shift pattern 300 in such a manner that the $0^{th}$ and $1^{st}$ order beams are exposed to a photoresist film on the semiconductor substrate at a uniform intensity.

In an example embodiment, the transmittance controller 400 is located on the phase-shift pattern 300, so that the transmittance of the illumination light that is incident onto the phase-shift pattern 300 is controlled. Particularly, the amount of the light passing through the phase-shift mask 300 may be controller by the transmittance controller 400, so that the intensity deviation between the $0^{th}$ and $1^{st}$ order beams may be minimized on the photoresist film on the semiconductor substrate.

For example, the transmittance controller 400 may include a diffusion layer that is diffused to a depth of about 100 nm to about 500 nm from a top surface of the phase-shift pattern 300. The transmittance controller 400 may comprise a metal having a large absorption coefficient. In the present embodiment, the transmittance controller 400 may comprise a metal having an absorption coefficient of no less than about 1.5. Examples of the metal may include chromium (Cr), molybdenum (Mo) and tungsten (W). In the present embodiment, the phase-shift pattern 300 may have a thickness of about 4,000 nm to about 6,000 nm, so that the transmittance controller 400 occupies about 1.25% to about 8.3% of the thickness of the phase-shift pattern 300 at an upper portion thereof.

According to the PSM 900 of embodiments of the present invention, the transmittance controller 400 is positioned on the phase-shift pattern 300, to thereby control the transmittance of the light passing through the phase-shift pattern 300. The intensity of the $0^{th}$ and $1^{st}$ order beams, which form the coherent light irradiated onto the photoresist film on the semiconductor substrate, may be determined in accordance with the amount of light passing through the phase-shift pattern 300, so that the transmittance controller 400 may minimize the intensity deviation between the $0^{th}$ and $1^{st}$ order beams. As a result, when the PSM 900 is used as a mask pattern for an exposure process, the intensity deviation between the $0^{th}$ and $1^{st}$ order beams may be sufficiently reduced to thereby improve the uniformity of the exposure process to the photoresist film on the semiconductor substrate.

FIGS. 3A to 3G are cross-sectional views illustrating processing steps for manufacturing the PSM shown in FIG. 2.

Figure 3A:
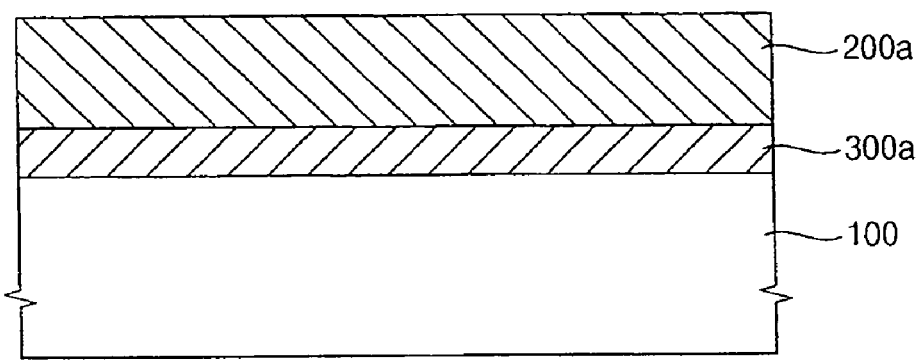
FIGS. 3A to 3G are cross-sectional views illustrating processing steps for manufacturing the PSM shown in FIG. 2.

Referring to FIGS. 2 and 3A, a phase-shift layer 300a and a light-shielding layer 200a are sequentially stacked on the transparent substrate 100 through which most of the light passes, to thereby form a blank mask layer on the transparent substrate 100.

For example, the phase-shift layer 300a may comprise molybdenum (Mo), molybdenum silicon (MoSi), molybdenum silicon nitride (MoSiN), molybdenum silicon oxynitride (MoSiON), molybdenum silicon carbonitride (MoSiCN), or molybdenum silicon carbon oxynitride (MoSiCON). These may be used alone or in combinations thereof. In addition, the light-shielding layer 200a may comprise chromium (Cr), chromium nitride (CrN), chromium carbide (CrC) or chromium carbonitride (CrCN). These may also be used alone or in combinations thereof. In the present example embodiment, the phase-shift layer 300a may comprise molybdenum silicon (MoSi), and the light-shielding layer 200a may comprise chromium (Cr). Further, the transparent substrate 100 may include a glass substrate comprising quartz, and the blank mask may be formed into an attenuated PSM in subsequent processes.

Figure 3B:
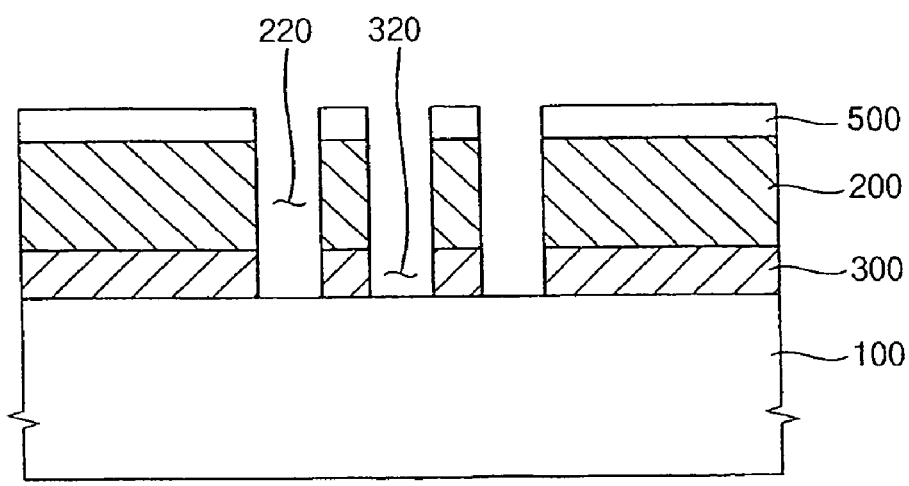

Referring to FIGS. 2 and 3B, the phase-shift layer 300a and the light-shielding layer 200a are partially removed from the transparent substrate 100, thereby forming the light-shielding pattern 200 including a first opening 220 and the phase-shift pattern 300 including a second opening 320 that is connected to the first opening 220. The transparent substrate 100 may be partially exposed through the first and second openings 220 and 320.

In example embodiments, a first mask pattern 500 is formed on the light-shielding layer 200a of the blank mask. The first mask pattern 500 may include a photoresist pattern that may be formed from a photoresist film by a photolithography process. Then, the light-shielding layer 200a is partially etched off using the first mask pattern 500 as an etching mask, thereby forming the first opening 220 through which the phase-shift layer 300a is partially exposed. Accordingly, the light-shielding layer 200a is formed into the light-shielding pattern 200 including the first opening 220. Thereafter, the first mask pattern 500 is removed from the light-shielding pattern 200. Then, the phase-shift layer 300a is partially etched off using the light-shielding pattern as an etching mask, thereby forming the second opening 320 consecutively to the first opening 220. Therefore, the phase-shift layer 300a is formed into the phase mask pattern 300 including the second opening 320.

In an example embodiment, the light-shielding layer 200a and the phase-shift layer 300a may be etched off by a dry etching process using a mixture of chlorine (Cl2) gas and oxygen (O2) gas as an etching gas or by a wet etching process using a mixture of ceric ammonium nitrate (Ce(NH4)2(NO3)6) and perchloric acid (HClO4) as an etchant. The composition of the etching gas or the etchant may be varied in accordance with the composition of the light-shielding layer 200a or the phase-shift layer 300a, as would be known to one of the ordinary skill in the art.

In another example embodiment, the light-shielding layer 200a and the phase-shift layer 300a may be sequentially and continuously etched off by a single etching process using the first mask pattern 500 as an etching mask. The first mask pattern 500 is formed on the light-shielding layer 200a, and the light-shielding layer 200a and the phase-shift layer 300a are partially etched off sequentially and continuously using the first mask pattern 500 as an etching mask, thereby forming the second opening 320 through which the transparent substrate 100 is partially exposed and the first opening 220 that is connected to the second opening 320.

Thereafter, the first mask pattern 500 is removed from the light-shielding pattern 200 by a strip process.

Figure 3C:
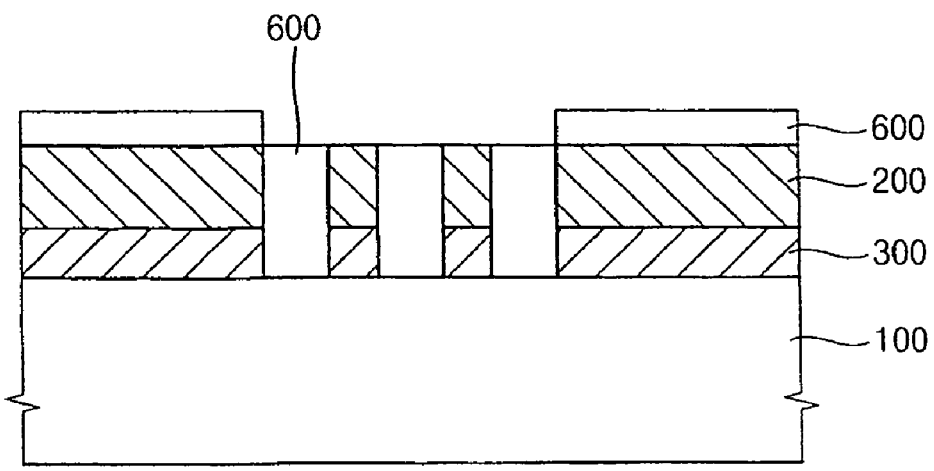

Referring to FIGS. 2 and 3C, a second mask pattern 600 is formed on the light-shielding pattern 200, and a transmitting portion is to be formed in the light-shielding pattern 200 in the following processes.

A mask layer (not shown) is formed on the light-shielding pattern 200 to a sufficient thickness to fill up the first and second openings 220 and 320, and then a planarization process is performed on the mask layer in such a manner that the mask layer has a given thickness from a top surface of the light-shielding pattern 200. The mask layer is partially removed from the light-shielding pattern 200 by a photolithography process, thereby forming the second mask pattern 600 through which the light-shielding pattern 200 is partially exposed. In the present embodiment, the processing conditions of the photolithography process are adjusted to sufficiently expose a top surface of the light-shielding pattern 200, and a top surface of the mask pattern 600 filling up the first and second openings 220 and 320 is positioned lower than or equal to the top surface of the light-shielding pattern 200. The removed portion of the mask pattern 600 is formed into a preliminary transmitting portion 240 in FIG. 3D that is formed into the transmitting portion 280 in FIG. 3F through which the illumination light is transmitted onto the transparent substrate 100 in a subsequent process.

Figure 3D:
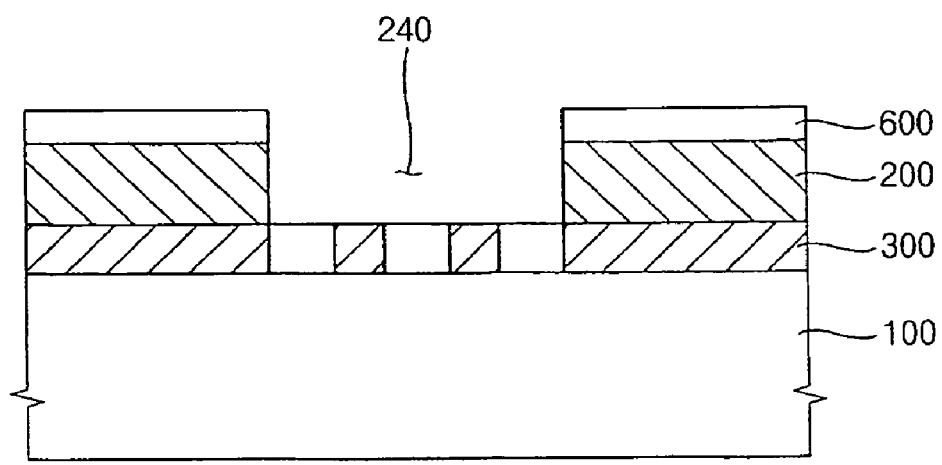

Referring to FIGS. 2 and 3D, the light-shielding pattern 200 is etched off from the phase-shift pattern 300 using the second mask pattern 600 as an etching mask, thereby forming the preliminary transmitting portion 240 through which the phase-shift pattern 300 is exposed. In some example embodiments, the light-shielding pattern 200 exposed through the second mask pattern 600 may be etched off by a dry etching process using a mixture of chlorine (Cl2) gas and oxygen (O2) gas as an etching gas or by a wet etching process using a mixture of ceric ammonium nitrate (Ce(NH4)2(NO3)6) and perchloric acid (HClO4) as an etchant in a process similar to that for forming the first and second openings 220 and 320. The phase-shift pattern 300 can function as an etching stop layer in the above etching process, so that only the light-shielding pattern 200 is removed from the transparent substrate 100. The second mask pattern 600 in the first opening 220 may also be removed from the transparent substrate 100 simultaneously with the light-shielding pattern 200. When an etch rate of the light-shielding pattern 200 is the same as that of the second mask pattern 600, a top surface of the second mask pattern 600 remaining in the second opening 320 is coplanar with a top surface of the phase-shift pattern 300. Embodiments of the present invention do not necessarily require that the top surface of the second mask pattern 600 in the second opening 320 be coplanar with the top surface of the phase-shift pattern 300, as would be known to one of the ordinary skill in the art. In the present embodiment, the second mask pattern 600 in the second opening 320 may be formed to have a sufficient thickness for protecting the transparent substrate 100 in a subsequent deposition process for forming the transmittance controller.

Figure 3E:
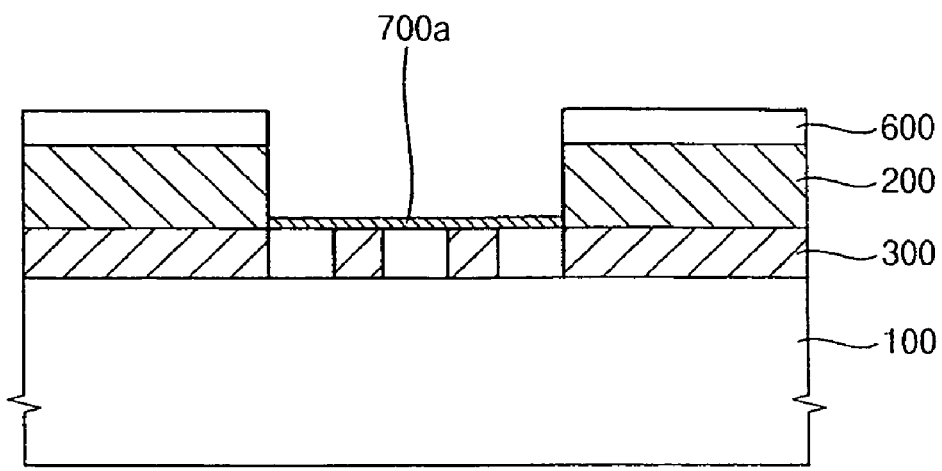

Referring to FIGS. 2 and 3E, a thin layer 700a is formed on the phase-shift pattern 300 and the second mask pattern 600 in the second opening 320.

In an example embodiment, a metal is deposited onto the phase-shift pattern 300 and the second mask pattern 600 in the preliminary transmitting portion 240 by a physical vapor deposition (PVD) process, thereby forming the metal thin layer 700a on the phase-shift pattern 300 and the second mask pattern 600. In the present embodiment, the transparent substrate 100 including the preliminary transmitting portion 240 is loaded into a chamber for a sputtering process in which a metal target is positioned. Inert gases such as argon (Ar) gases and helium (He) gases are supplied into the processing chamber and bias power of about 600 W to about 4,500 W is applied to the processing chamber. Then, the inert gases are transformed into plasma and the metal of the target is ionized in the processing chamber. The metal ions are deposited onto top surfaces of the phase-shift pattern 300 and the second mask pattern 600 in the preliminary transmitting portion 240.

For example, the metal may have an absorption coefficient of no less than about 1.5. Examples of the metal include chromium (Cr), molybdenum (Mo) and tungsten (W). These may be used alone or in combinations thereof. The magnitude of the absorption coefficient and the metal having the absorption coefficient may be varied in accordance with the wavelength of the illumination light, exposure conditions, and the desired design rule, size and/or shape of the pattern, so that the embodiments of the present invention should not be limited to these example metal materials but various other materials can be used as the metal, as would be apparent to one skilled in the art.

Figure 3F:
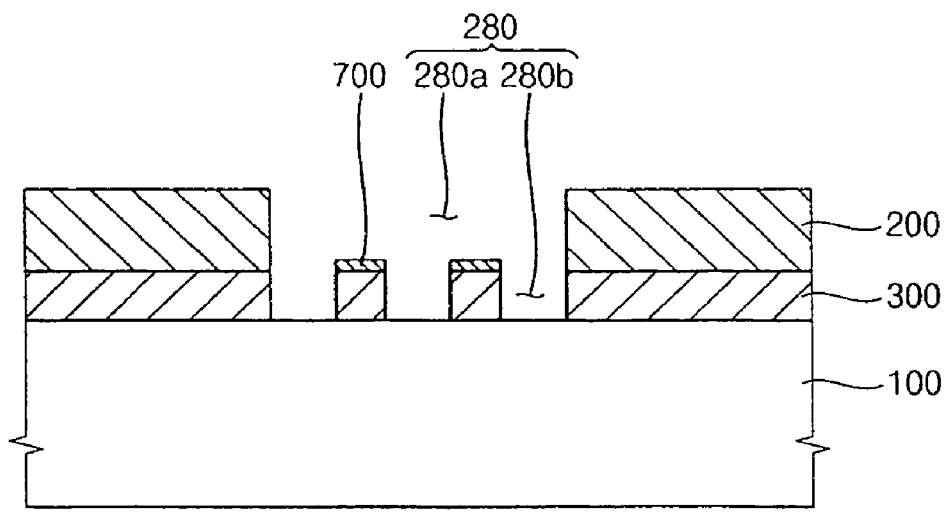

Referring to FIGS. 2 and 3F, the second mask pattern 600 is removed from the transparent substrate 100. In a case where the second mask pattern 600 includes a photoresist pattern, a strip process may be used for removing the second mask pattern 600. Particularly, when the second mask pattern 600 in the second opening 320 is removed from the transparent substrate 100, the thin layer 700a on the second mask pattern 600 is also removed from the transparent substrate 100 simultaneously with the second mask pattern 600. Therefore, the transparent substrate 100 is partially exposed through the second opening 320 and the thin layer 700a remains only on the phase-shift pattern 300, thereby forming a thin layer pattern 700 on the phase-shift pattern 300. As a result, the transmitting portion 280 defined by the light-shielding pattern 200 is formed on the transparent substrate 100. The transmitting portion 280 includes a first portion 280a defined by the light-shielding pattern 200 and a second portion 280b including the phase-shift pattern 300 for controlling the amount of the light transmitted thereto.

Figure 3G:
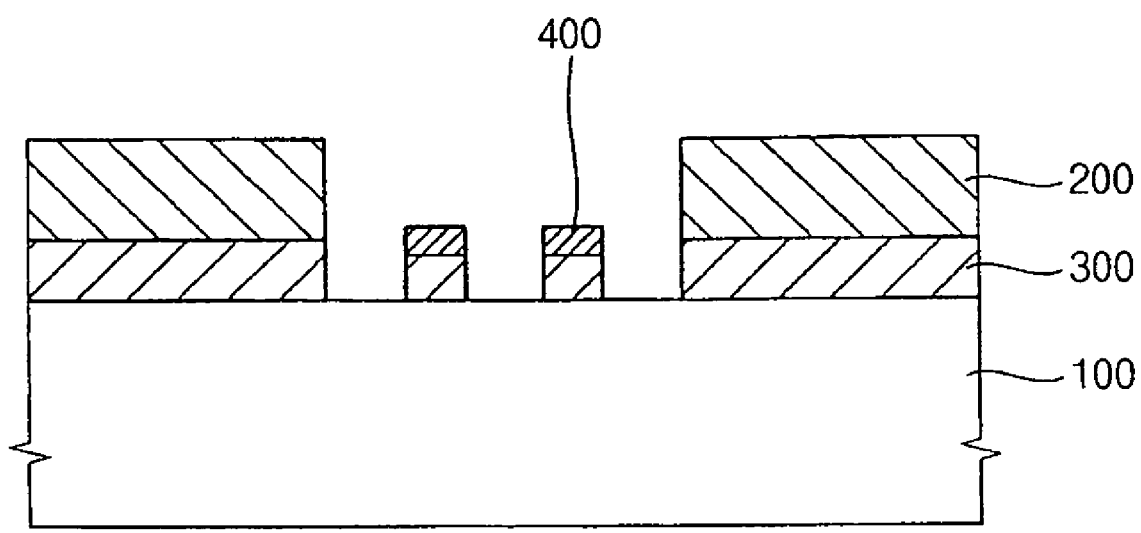

Referring to FIGS. 2 and 3G, a heat treatment is performed on the substrate 100 including the thin layer pattern 700, so that the metal in the thin layer pattern 700 is diffused into the phase-shift pattern 300. As a result, the transmittance controller 400 for controlling the amount of the light transmitted to the phase-shift pattern 300 is formed on the phase-shift pattern 300. The amount of the transmitted light may be determined by the material comprising the transmittance controller 400 and by the thickness of the transmittance controller 400.

The heat treatment may include a rapid thermal process using a tungsten-halogen lamp as a heat source. For example, the heat treatment may include an annealing process. The annealing process may be performed at a temperature of about 800° C. to about 1,500° C. for about 3 seconds to about 10 seconds. Accordingly, the metal material of the metal thin layer 700 may be diffused into the phase-shift pattern 300 at a depth about 100 nm to about 500 nm.

Figure 4A:
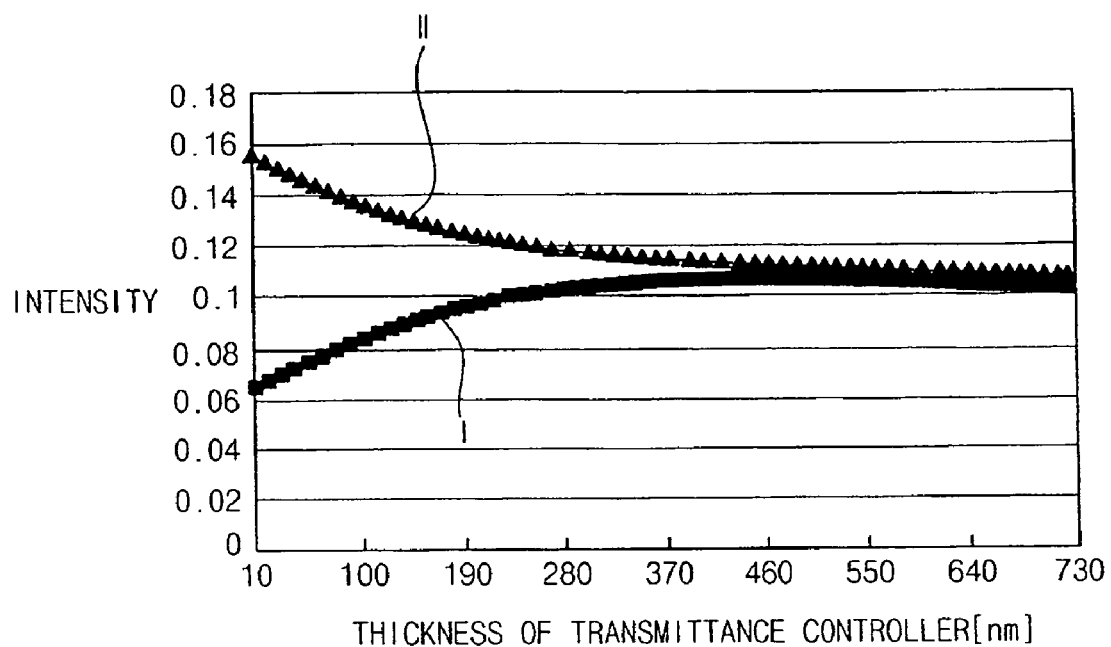
FIGS. 4A and 4B are graphs showing a relationship between the thickness of a transmittance controller and the intensity of transmitted light.
Figure 4B:
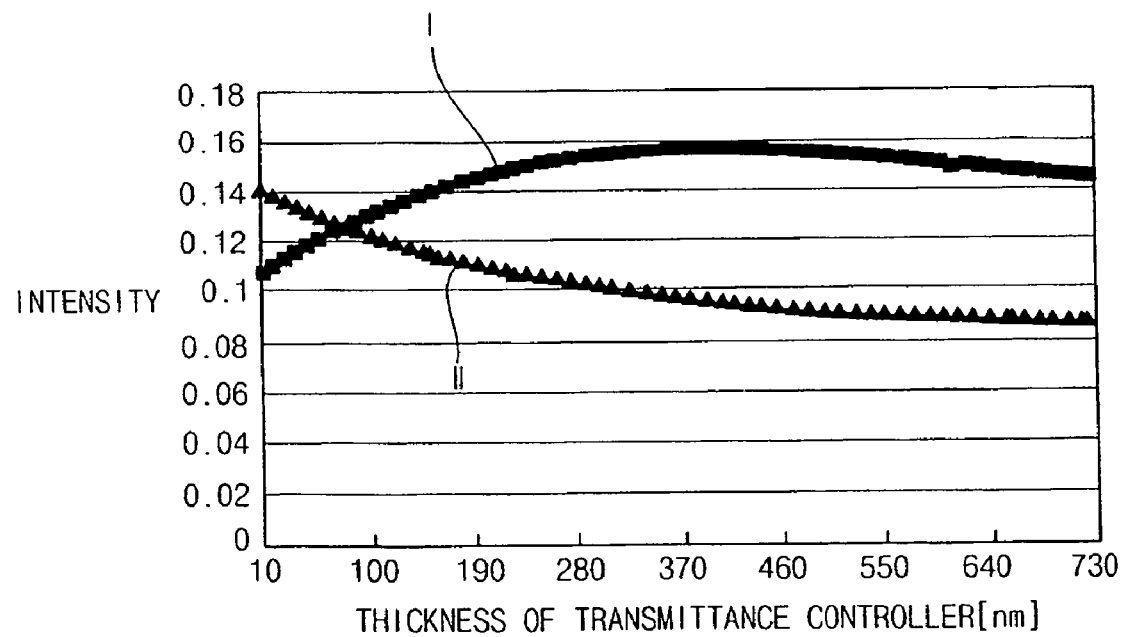

FIGS. 4A and 4B are graphs showing a relationship between the thickness of the transmittance controller and the intensity of the transmitted light. That is, FIGS. 4A and 4B indicate the thickness of the transmittance controller that minimizes the intensity deviation between diffracted beams. FIG. 4A shows experimental results in a case where the pattern size is about 45 nm, and FIG. 4B shows experimental results in a case where the pattern size is about 63 nm. Further, in FIGS. 4A and 4B, numeral I indicates intensity variation of the $0^{th}$ order beam, and numeral II indicates intensity variation of the $1^{st}$ order beam. Various experiments were performed for the results of FIGS. 4A and 4B under conditions in which an argon fluoride (ArF) excimer laser is used as a light source and the phase-shift pattern on which the transmittance controller comprising chromium (Cr) is positioned has a thickness of about 677 Å.

Referring to FIG. 4A, when an exposure process was performed to form a pattern having a half-pitch of about 45 nm using the PSM, the intensity deviation between the $0^{th}$ and the $1^{st}$ order beams continuously improved until the thickness of the transmittance controller increased to about 380 nm. However, when the thickness of the transmittance controller was more than about 380 nm, the intensity deviation between the $0^{th}$ and the $1^{st}$ order beams no longer improved. Referring to FIG. 4B, when an exposure process was performed to form a pattern having a half-pitch of about 63 nm using the PSM, the intensity deviation between the $0^{th}$ and the $1^{st}$ order beams was minimized when the thickness of the transmittance controller was about 90 nm. In contrast, the intensity deviation between the $0^{th}$ and the $1^{st}$ order beams increased when the thickness of the transmittance controller was more than about 90 nm.

Accordingly, the intensity deviation between the $0^{th}$ and the $1^{st}$ order beams may be improved by the transmittance controller, and the optimal thickness of the transmittance controller for minimizing the intensity deviation may be varied in accordance with processing conditions for an exposure process.

The improvement of the intensity deviation between the $0^{th}$ and the $1^{st}$ order beams may extend an allowable error range of a depth of focus (DOF) and a proper dose of the light for the exposure process, so that the process window and the exposure latitude of the exposure process may be enlarged, thereby increasing the processing margin of the exposure process.

Figure 5A:
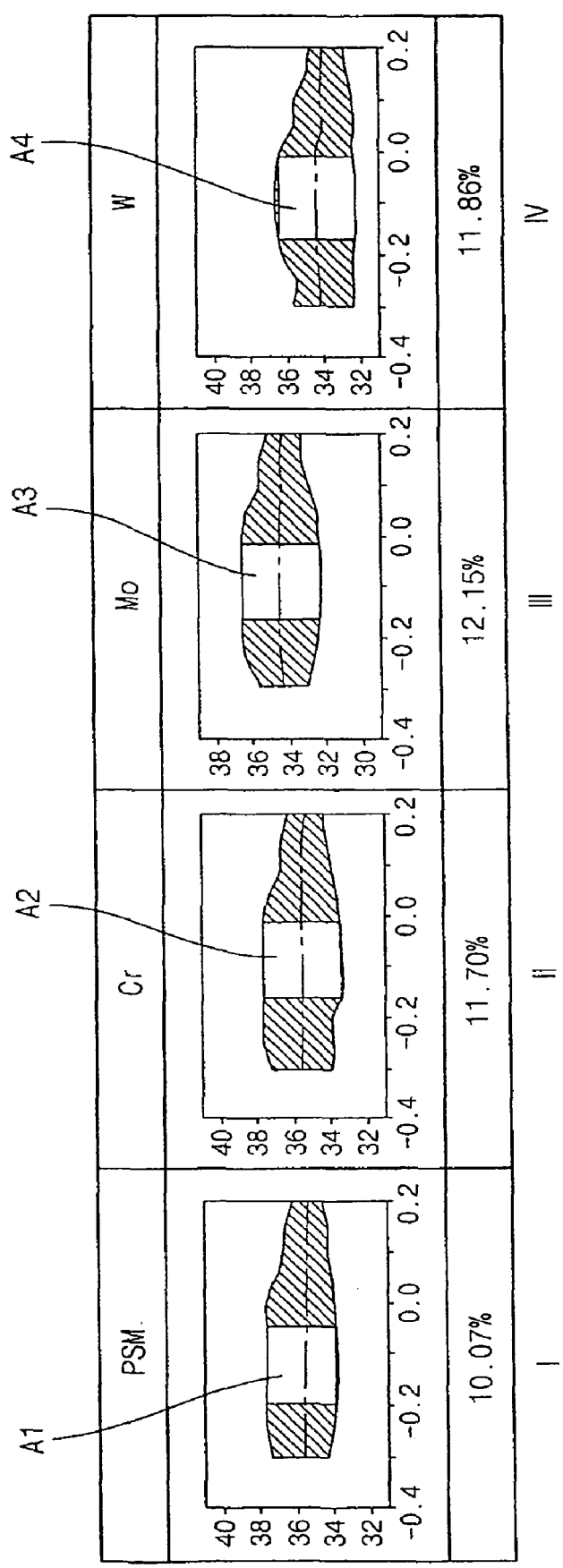
FIGS. 5A and 5B are graphs showing process windows and exposure latitudes of exposure processes in which the PSM including the transmittance controller is used.
Figure 5B:
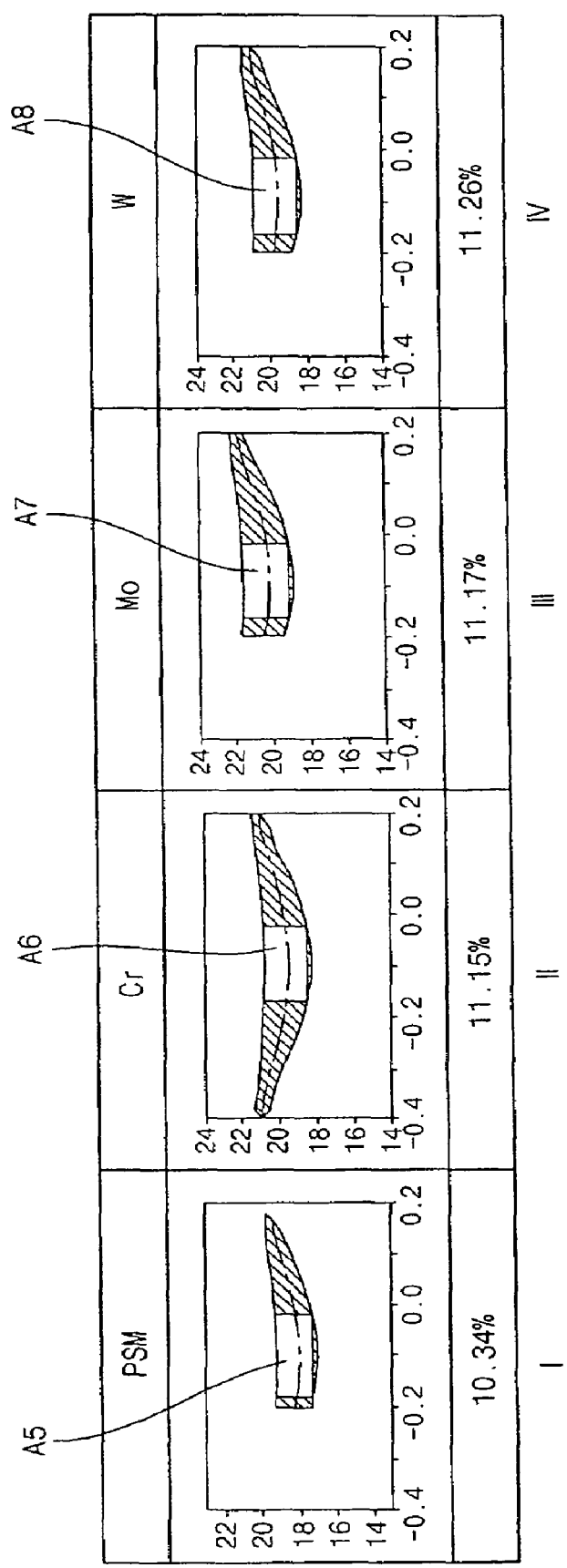

FIGS. 5A and 5B are graphs showing process windows and exposure latitudes of exposure processes in which the PSM including the transmittance controller is used. FIG. 5A shows experimental results of the exposure process for forming a pattern having a half-pitch of about 45 nm, and FIG. 5B shows experimental results of the exposure process for forming a pattern having a half-pitch of about 63 nm. In FIGS. 5A and 5B, Graph I shows experimental results of the exposure process using a conventional attenuated PSM without the transmittance controller, and Graph II shows experimental results of the exposure process using an attenuated PSM including the transmittance controller that comprises chromium (Cr). Graph III shows experimental results of the exposure process using an attenuated PSM including the transmittance controller that comprises molybdenum (Mo), and Graph IV shows experimental results of the exposure process using an attenuated PSM including the transmittance controller that comprises tungsten (W). In FIGS. 5A and 5B, the horizontal axis denotes a DOF of the exposure process, and the vertical axis denotes a dose of the light. The process window of the exposure process is denoted as reference letter $A_i$ in each of the graphs. The process window indicates an allowable range of the dose at an optimal DOF in each of the exposure processes. As a result, as the process window becomes larger, the processing margin of the exposure process becomes greater. Since the processing margin of the exposure process is enlarged, the possibility of processing defects may be decreased, to thereby improve the reliability of the exposure process.

Referring to FIG. 5A, when an exposure process was performed for forming the pattern having a half-pitch of about 45 nm, the transmittance controller on the attenuated PSM increased the size of the process window. That is, the sizes of the process windows A2, A3, and A4 that were caused by an exposure process using the attenuated PSM including the transmittance controller were much greater than the size of the process window A1 that was caused by an exposure process using the attenuated PSM without the transmittance controller. Further, the transmittance controller also improved the exposure latitude, for example, from about 10.07% to about 11.70%, 12.15% and 11.86%, respectively.

Referring to FIG. 5B, when an exposure process is performed for forming the pattern having a half-pitch of about 63 nm, the transmittance controller on the attenuated PSM also increased the size of the process window. That is, the sizes of the process windows A6, A7, and A8 that were caused by an exposure process using the attenuated PSM including the transmittance controller were much greater than the size of the process window A5 that was caused by an exposure process using the attenuated PSM without the transmittance controller. Further, the transmittance controller also improved the exposure latitude, for example, from about 10.34% to about 11.15%, 11.71% and 11.26%, respectively.

Accordingly, the presence of the transmittance controller on the phase-shift pattern can operate to improve the process window and exposure latitude of the exposure process as well as decrease the intensity deviation between the $0^{th}$ and the $1^{st}$ order beams.

According the example embodiments of the present invention, a transmittance controller comprising a metal is formed on an upper portion of a phase-shift pattern of an attenuated PSM, thereby minimizing an intensity deviation between $0^{th}$ and $1^{st}$ order beams of illumination light at a photoresist film on a semiconductor substrate. In addition, the transmittance controller of the attenuated PSM may also improve the size of a process window and the size of an exposure latitude in an exposure process, thereby increasing the processing margin of the exposure process. As a result, the process reliability of an exposure process may be sufficiently increased despite a small pattern size, so that a minute pattern may be formed on a semiconductor substrate with sufficient accuracy.

Although the example embodiments of the present invention have been described, it is understood that the present invention should not be limited to these example embodiments but various changes and modifications can be made by one skilled in the art within the spirit and scope of the present invention as hereinafter claimed.

What is claimed is:

1. A method of forming a phase- shift mask (PSM), comprising:
    sequentially forming a phase-shift layer and a light-shielding layer on a transparent substrate, to thereby form a blank mask on the transparent substrate;
    forming a light-shielding pattern and a phase-shift pattern by consecutively and partially removing the phase-shift layer and the light-shielding layer, the light-shielding pattern including a first opening and the phase-shift pattern including a second opening that is connected to the first opening and partially exposes the transparent substrate; and
    forming a transmitting portion by partially removing the light-shielding pattern, the transmitting portion including at least one portion of the phase-shift pattern on which a transmittance controller is formed;
    wherein forming the transmitting portion includes:
        forming a mask layer on the light-shielding pattern to a sufficient thickness to fill up the first and second openings;
        forming a second mask pattern through which the light-shielding pattern is partially exposed;
        etching the exposed light-shielding pattern off of the phase-shift pattern using the second mask pattern as an etching mask simultaneously with the second mask pattern in the first opening, to thereby form a preliminary transmitting portion through which the phase-shift pattern and the second mask pattern in the second opening are exposed;
        forming a thin layer on the phase-shift pattern and second mask pattern exposed in the second opening of the preliminary transmitting portion; and
        diffusing a material of the thin layer into the phase-shift pattern.

2. The method of claim 1, wherein the phase-shift layer comprises a material selected from the group consisting of molybdenum (Mo), molybdenum silicon (MoSi), molybdenum silicon nitride (MoSiN), molybdenum silicon oxynitride (MoSiON), molybdenum silicon carbonitride (MoSiCN), and molybdenum silicon carbon oxynitride (MoSiCON), and the light-shielding layer comprises a material selected from the group consisting of chromium (Cr), chromium nitride (CrN), chromium carbide (CrC), and chromium carbonitride (CrCN).

3. The method of claim 1, wherein the transparent substrate comprises quartz, and the blank mask includes an object mask for an attenuated PSM.

4. The method of claim 1, wherein forming the light-shielding pattern and the phase-shift pattern includes:
    forming a first mask pattern on a surface of the blank mask;
    partially etching the light-shielding layer using the first mask pattern as an etching mask, to thereby form the light-shielding pattern including the first opening through which the phase-shift layer is partially exposed;
    removing the first mask pattern from a surface of the light-shielding pattern; and
    partially etching the phase-shift layer using the light-shielding pattern as an etching mask, to thereby form the phase-shift pattern including the second opening that is connected to the first opening.

5. The method of claim 4, wherein the first mask pattern includes a photoresist pattern that is formed on the blank mask by a photolithography process.

6. The method of claim 4, wherein the etching of the light-shielding layer and the phase-shift layer is performed by a dry etching process using a mixture of chlorine (Cl2) gas and oxygen (O2) gas as an etching gas.

7. The method of claim 4, wherein the etching of the light-shielding layer and the phase-shift layer is performed by a wet etching process using a mixture of ceric ammonium nitrate (Ce(NH4)2(NO3)6) and perchloric acid (HClO4) as an etchant.

8. The method of claim 1, wherein forming the light-shielding pattern and the phase-shift pattern includes:
    forming a first mask pattern on a surface of the blank mask;
    partially etching the light-shielding layer and the phase-shift layer sequentially using the first mask as an etching mask, to thereby form the second opening through which the transparent substrate is partially exposed and the first opening that is connected to the second opening; and
    removing the first mask pattern from a surface of the light-shielding pattern.

9. The method of claim 1, wherein the etching of the light-shielding layer is performed by a dry etching process using a mixture of chlorine (Cl2) gas and oxygen (O2) gas as an etching gas.

10. The method of claim 1, wherein the etching of the light-shielding layer is performed by a wet etching process using a mixture of ceric ammonium nitrate (Ce(NH4)2(NO3)6) and perchloric acid (HClO4) as an etchant.

11. The method of claim 1, wherein forming the thin layer on the phase-shift pattern includes depositing a metal material onto a surface of the phase-shift pattern exposed through the preliminary transmitting portion using the second mask pattern on the light-shielding pattern as a deposition mask.

12. The method of claim 11, wherein the metal material has an absorption coefficient of no less than about 1.5.

13. The method of claim 12, wherein the metal material includes any one selected from the group consisting of chromium (Cr), molybdenum (Mo), tungsten (W) and combinations thereof.

14. The method of claim 11, wherein the depositing of the metal material is performed by a physical vapor deposition (PVD) process.

15. The method of claim 14, wherein the PVD process includes a sputtering process that is performed using bias power of about 600 W to about 4,500 W using helium (He) gas or argon (Ar) gas as a sputtering gas.

16. The method of claim 1, wherein the diffusing of the material of the thin layer is performed by an annealing process.

17. The method of claim 16, wherein the annealing process is performed in a rapid thermal treatment apparatus using a tungsten-halogen lamp as a heat source.

18. The method of claim 17, prior to the annealing process, further comprising removing a portion of the thin layer and the second mask pattern in the second opening while removing the second mask pattern on residual elements of the light shielding pattern in such a manner that the preliminary transmitting portion is connected to the second opening to thereby form the transmitting portion through which transparent substrate is exposed.

* * * * *